(12) United States Patent
Manninger et al.

(10) Patent No.: US 8,542,840 B2
(45) Date of Patent: Sep. 24, 2013

(54) APPARATUS AND METHOD FOR FILTERING A SIGNAL TO MATCH A LOUDSPEAKER

(75) Inventors: Mario Manninger, Unterpremstaetten (AT); Franz Fuerbass, Vienna (AT)

(73) Assignee: AMS AG, Unterpremstaetten (AT)

( * ) Notice: Subject to any disclaimer, the term of this patent is extended or adjusted under 35 U.S.C. 154(b) by 233 days.

(21) Appl. No.: 12/954,031

(22) Filed: Nov. 24, 2010

(65) Prior Publication Data

US 2011/0293106 A1    Dec. 1, 2011

(30) Foreign Application Priority Data

Nov. 26, 2009   (DE) .......................... 10 2009 055 889

(51) Int. Cl.
*H04R 29/00*      (2006.01)
(52) U.S. Cl.
USPC ............ 381/59; 381/71.12; 381/98; 381/103; 381/58
(58) Field of Classification Search
USPC ............... 381/56–59, 66, 71.9–71.12, 83, 93, 381/98–103; 700/94; 379/406.01–406.08
See application file for complete search history.

(56) References Cited

U.S. PATENT DOCUMENTS

| | | | |
|---|---|---|---|
| 5,528,695 A | | 6/1996 | Klippel |
| 5,694,476 A | * | 12/1997 | Klippel ............................. 381/96 |
| 5,715,320 A | * | 2/1998 | Allie et al. ................. 381/71.12 |
| 8,199,924 B2 | * | 6/2012 | Wertz et al. ................... 381/71.1 |
| 8,345,886 B2 | * | 1/2013 | Park ................................. 381/59 |
| 2003/0122605 A1 | * | 7/2003 | Ulrick et al. ................... 327/309 |
| 2007/0154021 A1 | * | 7/2007 | Bohman .......................... 381/59 |
| 2009/0268918 A1 | * | 10/2009 | Solgaard et al. ................. 381/55 |

FOREIGN PATENT DOCUMENTS

| | | |
|---|---|---|
| DE | 43 36 609 | 5/1995 |
| DE | 601 25 258 | 5/2007 |
| EP | 1 126 743 | 1/2001 |

OTHER PUBLICATIONS

A. Bright, "Discrete-time loudspeaker modelling", Audio Engineering Society, Convention Paper 5847, pp. 1-25, presented at the 114th Convention, Mar. 22-25, 2003, Amsterdam, Netherlands.
A. Bright, "Tracking Changes in Linear Loudspeaker Parameters with Current Feedback", Audio Engineering Society, Convention Paper 5909, pp. 1-11, presented at the 115th Convention, Oct. 10-13, 2003, New York, NY.

* cited by examiner

*Primary Examiner* — Joseph Saunders, Jr.
*Assistant Examiner* — James Mooney
(74) *Attorney, Agent, or Firm* — McDermott Will & Emery LLP

(57) ABSTRACT

A signal-processing circuit for the generation of a loudspeaker signal may include an input for the feeding of a digital input signal and a digital equalizer filter that is coupled with the input and has at least one first recursive filter that is defined by a first adjustable set of coefficients, an amplification device, a current measurement device, a digital filter block that may be configured to generate, through filtering, an estimate signal as a function of the measurement signal, and a matching block that may be configured to determine a new set of coefficients as a function of the measurement signal, the estimate signal, and the filtered input signal.

16 Claims, 3 Drawing Sheets

US 8,542,840 B2

APPARATUS AND METHOD FOR FILTERING A SIGNAL TO MATCH A LOUDSPEAKER

RELATED APPLICATIONS

This application claims the priority of German application no. 10 2009 055 889.6 filed Nov. 26, 2009, the entire content of which is hereby incorporated by reference.

FIELD OF THE INVENTION

The invention relates to a signal-processing circuit for the generation of a loudspeaker signal and to a signal-processing method.

BACKGROUND OF THE INVENTION

Small and flat loudspeakers in mobile radio devices and other portable devices typically have a resonance frequency that changes as a function of the temperature and the life of the loudspeaker. In the driving of such loudspeakers, it is possible that the loudspeaker will be permanently damaged if too high a power is provided at this resonance frequency in the driving loudspeaker signal.

Therefore, in the driving of such loudspeakers, many times the total power of the loudspeaker signal is limited, in order to prevent a destruction of the loudspeaker. In this way, however, the efficiency of the driving of the loudspeaker is reduced.

In a different approach for generating a suitable loudspeaker signal, it is attempted to define a transfer function of the loudspeaker with reference to a mathematical model and to derive from the parameters of the loudspeaker model defined in this way a filter function with which frequencies in an input signal to be processed are damped in the region of the resonance frequency. The calculation of the parameters of the loudspeaker model and the derivation of the parameters for the filter function require a computational effort that makes the use of a signal processor necessary. Just in the field of mobile radio devices and portable devices, however, it is desirable to avoid the use of signal processors as much as possible, in order to reduce the energy consumption of the devices and thus to increase the battery operating time.

SUMMARY OF THE INVENTION

It is therefore an object of the invention to provide a signal-processing circuit for the generation of a loudspeaker signal and a signal-processing method with which a loudspeaker signal is output that is filtered matching to the loudspeaker being used, wherein a matching of the filtering is realized with lower effort.

One embodiment of a signal-processing circuit for the generation of a loudspeaker signal comprises an input for the feeding of a digital, time-discrete input signal, as well as a digital equalizer filter that is coupled with the input and has at least one first recursive filter of second order that is defined by a first adjustable set of coefficients. An amplification device coupled with the equalizer filter with a digital-analog converter and an amplifier is designed to generate the loudspeaker signal as a function of the input signal filtered by the equalizer filter and to output on an output terminal. A current measurement device coupled with the amplification device is designed to output a digital, time-discrete measurement signal that represents a current of the loudspeaker signal. The signal-processing circuit further has a digital filter block that is designed to generate, through filtering, an estimate signal as a function of the measurement signal. For this purpose, the filter block has at least one second recursive filter of second order that is defined by a second adjustable set of coefficients. A matching block of the signal-processing circuit is designed to define a new set of coefficients as a function of the measurement signal, the estimate signal, and the filtered input signal and to use the newly defined coefficients in the first and second adjustable set of coefficients such that the resulting transfer functions of the at least one first and of the at least one second filter are inverse relative to each other.

In the described signal-processing circuit, the filtering is performed both with the equalizer filter and also with the filter block completely in the digital domain, so that the occurring signals can be uniquely represented by a digital value at each time defined by a sampling rate. In contrast, the loudspeaker signal is an analog signal that is advantageously output as a voltage between two output posts of the output terminal. A current of the loudspeaker signal flowing across the output posts is detected using measurement techniques and output digitally sampled to the filter block. An overall transfer function of the filter block ideally represents a current-voltage ratio in the loudspeaker signal or a transfer function of a connected loudspeaker.

The first and the second recursive filters of second order are advantageously identically constructed regarding their structure, so that, in particular, current and past input signal values and past output signal values are included in the calculation of a current output signal value. The calculation of the current output signal value depends on the first or second adjustable set of coefficients. In particular, the respective output signal value is formed by the sum and difference formation of signal values weighted with the coefficients.

In the matching block, with known matching algorithms the new set of coefficients are defined such that these coefficients can be used directly in the first and second recursive filters. For use in the first and second adjustable set of coefficients, the newly defined coefficients are advantageously each used directly or indirectly, so that no complicated calculations are required, in order to calculate the first and second adjustable set of coefficients from the newly defined coefficients.

However, for the use of the new coefficients in the first and second adjustable set of coefficients, transpositions are performed so that, in particular for the same filter structure of the first and second recursive filters, different, in particular, inverse transfer functions are produced. Here, with transfer functions that are inverse relative to each other it is understood that, for a mathematical series arrangement of the two transfer functions, a resulting overall transfer function in the total frequency range to be considered is equal in terms of magnitude, advantageously is equal to one. In other words, in this case the transfer function of the first and of the second recursive filters cancel each other out.

For example, the second recursive filter represents the resonance frequency response of a loudspeaker that is connected during operation to the signal-processing circuit that has, in the resonance frequency range, an overshoot. The inverse transfer function of the first recursive filter has, accordingly, in the resonance frequency range, an attenuation so that critical frequencies in the input signal could be attenuated, in order to prevent too high a power output to the loudspeaker.

In one embodiment, the equalizer filter filters the input signal and generates the filtered input signal.

In one embodiment, an output of the equalizer filter is connected to an input of the amplification device.

In one embodiment, an output of the amplification device is connected to the current measurement device. The current measurement device is arranged between said output of the amplification device and the loudspeaker. The current measurement device is designed to generate the measurement signal by the measurement of the current flowing from the amplification device to the loudspeaker.

In one embodiment, the new set of coefficients comprises at least the coefficients A1, A2, B1, B2. Here, the transfer function of the at least one first recursive filter in the Z-plane reads $$H_{EQ}(z) = \frac{1 + A1 \cdot z^{-1} + A2 \cdot z^{-2}}{1 + B1 \cdot z^{-1} + B2 \cdot z^{-2}}.$$

The transfer function of the at least one second recursive filter in the Z-plane reads $$H_{RES}(z) = \frac{1 + B1 \cdot z^{-1} + B2 \cdot z^{-2}}{1 + A1 \cdot z^{-1} + A2 \cdot z^{-2}}.$$

From the transfer functions $H_{EQ}(z)$ and $H_{RES}(z)$ one sees that each uses the coefficients A1, A2, B1, B2, wherein the denominator and numerator functions of the filter are transposed. In other words, the transfer functions are inverse relative to each other.

In one embodiment, the first adjustable set of coefficients of the first recursive filter of the equalizer filter and the second adjustable set of coefficients of the second recursive filter of the filter block comprise the same adjustable coefficients. The first and the second recursive filter may employ the identical coefficients with identical values. However, the first and the second recursive filter can use the coefficients in a different manner or may use the coefficients in two different sequences. For example, the first adjustable set of coefficients may be divided in a first and a second sub-set. The first sub-set of coefficients determines the denominator of the transfer function of the first recursive filter and the nominator of the transfer function of the second recursive filter, whereas the second sub-set of coefficients determines the nominator of the transfer function of the first recursive filter and the denominator of the transfer function of the second recursive filter.

In one embodiment, the matching block determines the new set of coefficients such that the matching block calculates new values of these coefficients. Therefore, the values of the first and the second adjustable set of coefficients are calculated by the matching block. The number of coefficients is constant and is not changed by the matching block; only the values of the single coefficients are amended by the matching block. The matching block calculates the values of the new set of coefficients, wherein the values depend on the measurement signal, the estimate signal, and the filtered input signal. The matching block provides the new values of the new set of coefficients to the first and to the second recursive filter. Thus, the values of the coefficients comprised by the first adjustable set of coefficients of the first recursive filter and the values of the coefficients comprised by the second adjustable set of coefficients of the second recursive filter have their origin in the values of the new set of coefficients and, therefore, were calculated by the matching block. In such a manner, the matching block may use the newly determined coefficients in the first and second adjustable set of coefficients.

In addition to the second recursive filter, the filter block could also comprise, for filtering, a digital high-pass filter that impresses a high-pass response of a connected loudspeaker during operation independent on the resonance response. Coefficients of the digital high-pass filter are advantageously fixed or adjustable by programming and are not taken into account in the calculation of the new set of coefficients in the matching block. A transfer function of the high-pass filter in the Z-plane reads, for example, $$H_{HP}(z) = \frac{1 + C1 \cdot z^{-1}}{1 + D1 \cdot z^{-1}}.$$

Furthermore it is possible, in addition to the first and the second recursive filters of second order, to also provide other filters each in the digital filter block and in the digital equalizer filter whose coefficients are defined analogous to the previously described method in the matching block, wherein the preparation of the coefficients on these additional filters, in turn, occur such that the resulting transfer functions are inverse relative to each other. In other words, the resonance frequency response and the associated equalizer function could also be realized by digital recursive filters of higher order.

In a further embodiment of the signal-processing circuit, the equalizer filter is designed to also weight the input signal with a first weighting factor. Furthermore, the filter block is designed to generate, in the filtering, the estimate signal also as a function of a second weighting factor. The matching block is here designed to define a new weighting factor as a function of the measurement signal, the estimate signal, and the filtered input signal and to set the first and the second weighting factor as a function of the newly defined weighting factor. In this way, absolute ratios of the respective signals are also taken into account relative to each other.

In one embodiment, the matching block calculates the value of the new weighting factor. The value of the new weighting factor depends on the measurement signal, the estimate signal, and the filtered input signal. Moreover, the value of the first weighting factor and the value of the second weighting factor can depend on the value of the weighting factor. Thus, the value of the first weighting factor and the value of the second weighting factor may be calculated by the matching block.

In one embodiment of the signal-processing circuit, the matching block is designed to perform the definition of the new set of coefficients or the new weighting factor by means of a least-means-squares, LMS, algorithm. Advantageously, the matching block is designed to define an instantaneous error value used for the LMS algorithm from a difference of an instantaneous value of the estimate signal and a delayed instantaneous value of the filtered input signal. The delay of the filtered input signal is here selected matching to a signal propagation time in the amplification device and to the processing time in the current measurement device and the filter block.

In one embodiment, the matching block is implemented to perform the calculation of at least one part of a group comprising the new weighting factor and the new set of coefficients by means of the LMS algorithm.

In one embodiment of the signal-processing circuit, the current measurement device comprises a current measurement resistor and an analog-digital converter that outputs the measurement signal as a function of a voltage drop across the current measurement resistor.

The amplifier in the amplification device is constructed, for example, as a class-A amplifier, as a class-AB amplifier, or as a class-D amplifier. The current measurement device is matched as a function of the amplifier type used for the measurement of the current in the loudspeaker signal. In particular, for the use of a class-D amplifier, a current measurement can be used in combination with a sample and hold circuit.

In one embodiment of a signal-processing method that is performed advantageously with a signal-processing circuit according to one of the previously described embodiments, a digital, time-discrete input signal is prepared. The input signal is filtered with at least one first recursive filter of second order that is defined by a first adjustable set of coefficients. An analog loudspeaker signal is generated as a function of the filtered input signal. Furthermore, a digital, time-discrete measurement signal is generated that represents a current of the loudspeaker signal. An estimate signal is generated by the filtering of the measurement signal with at least one second recursive filter of second order that is defined by a second adjustable set of coefficients. As a function of the measurement signal, the estimate signal, and the filtered input signal, a new set of coefficients is defined. The newly defined coefficients are used in the first and second adjustable set of coefficients such that the resulting transfer functions of the at least one first and the at least one second filter are inverse relative to each other.

The described signal-processing method thus distinguishes itself, in turn, in that with known methods a set of coefficients is defined that can be used without additional processing directly in the first and second recursive filters. The coefficients are here used advantageously merely transposed in corresponding filter structures of the first and second recursive filters such that the resulting transfer functions cancel each other out, that is, are inverse relative to each other.

As previously described for the embodiments of the signal-processing circuit, the transfer functions of the first and second recursive filters could be expressed as functions in the Z-plane with transposed denominator and numerator functions. Furthermore, weighting factors could be used that could likewise be matched adaptively. Advantageously, for the definition of the new set of coefficients and/or the weighting factors, an LMS algorithm is used.

The previously described embodiments of the signal-processing circuit and of the signal-processing method can be combined with each other arbitrarily, even if they are described as individual embodiments.

In one embodiment, the at least one first recursive filter, which is comprised by the equalizer filter, filters the input signal and generates the filtered input signal.

BRIEF DESCRIPTION OF THE DRAWINGS

Identical elements, function blocks, and signals carry identical reference symbols in the drawings and therefore do not need to be described multiple times.

DETAILED DESCRIPTION OF THE DRAWINGS

Figure 1:
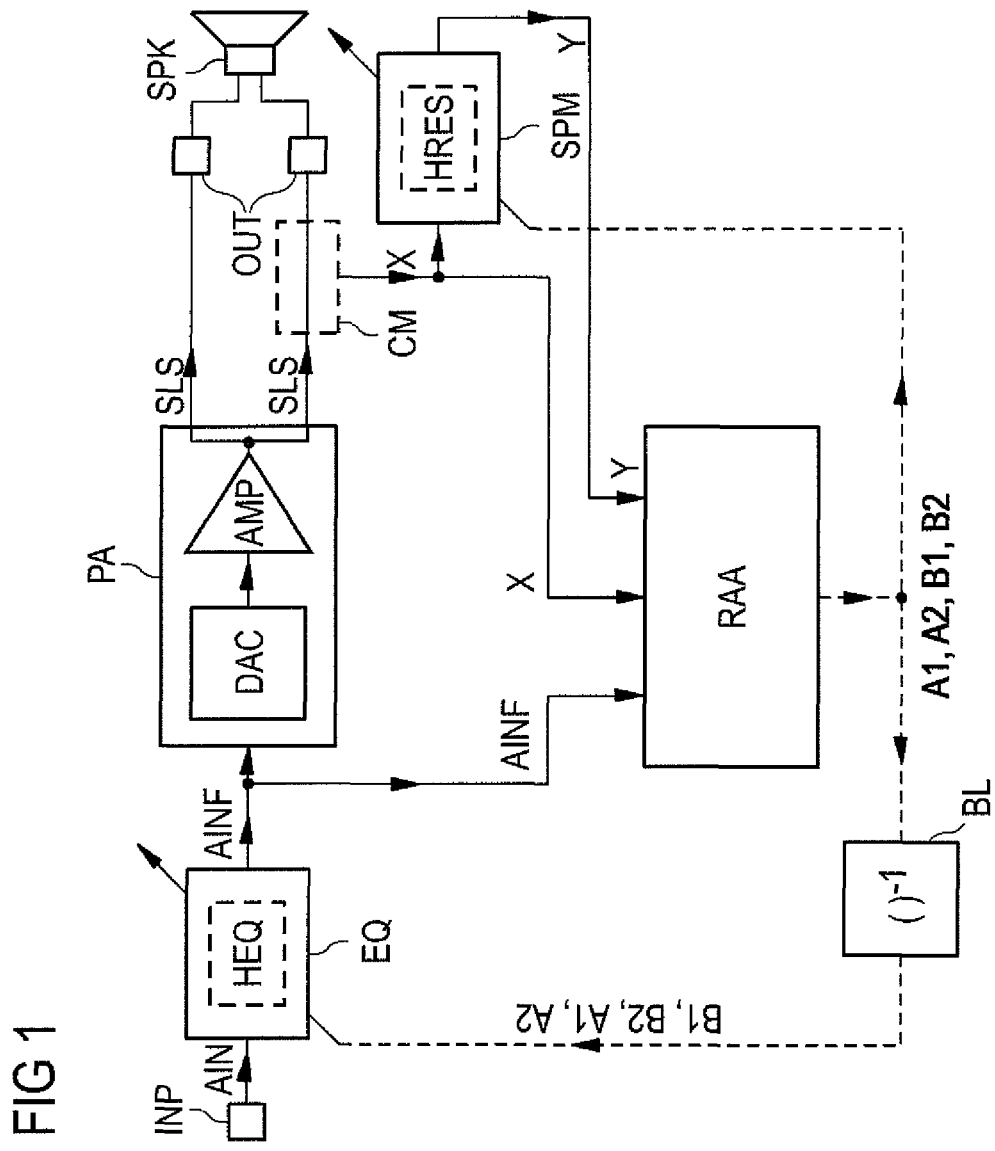
FIG. 1 shows a schematic block diagram of a first embodiment of a signal-processing circuit.

FIG. 1 shows one embodiment of a signal-processing circuit for the generation of a loudspeaker signal. A digital equalizer filter EQ is coupled on the input side with an input INP. On the output side, the equalizer filter EQ is connected to an amplification device PA that comprises a digital-analog converter DAC and an amplifier AMP. In the equalizer filter EQ, a first digital recursive filter HEQ of second order is provided. The amplification device PA is connected on the output side to output posts of an output terminal OUT to which a loudspeaker SPK is attached. The loudspeaker SPK is not a required component of the signal-processing circuit.

The signal-processing circuit further comprises a matching block RAA that is attached on the input side to the output of the equalizer filter EQ, to a current measurement device CM, and to an output of a digital filter block SPM. The current measurement device CM is arranged such that it can measure a current in the loudspeaker signal SLS that is output on the output terminal OUT. The filter block SPM is likewise connected on the input side to the current measurement device CM and has a second digital recursive filter HRES.

The matching block RAA is coupled on the output side with corresponding setting inputs of the filter block SPM and of the equalizer filter EQ, in order to set respective filter transfer functions.

During operation of the signal-processing circuit, a digital, time-discrete input signal AIN that is filtered by the digital equalizer filter EQ, in particular, with the first recursive filter HEQ is fed via the input INP.

As the filter result, the similarly digitally filtered input signal AINF is available that is fed to the amplification device PA and the matching block RAA. In the amplification device PA, the filtered input signal AINF is converted with the digital-analog converter DAC and the amplifier AMP into the analog loudspeaker signal SLS or processed to form the loudspeaker signal SLS that finally drives the loudspeaker SPK.

By the current measurement device CM, a current in the loudspeaker signal SLS is measured and a digital, time-discrete measurement signal X representing this current is generated. The measurement signal X is fed on one hand to the matching block RAA for further processing and also to the filter block SPM that generates, through filtering, in particular, with the second recursive filter HRES, a digital estimate signal Y that is fed, in turn, to the matching block RAA. The filter block SPM could also comprise additional filter elements in addition to the second recursive filter HRES. In the ideal case, the total transfer function of the filter block SPM that depends on the transfer function of the second recursive filter HRES represents a relationship between the current that is output on the loudspeaker SPK and the voltage on the output terminal OUT. In other words, the filter block SPM represents the frequency-dependent transfer response of the attached loudspeaker SPK.

So that the filter block SPM approximates the transfer function of the loudspeaker SPK as good as possible, by the matching block RAA, in particular, the coefficients of the second recursive filter HRES are matched adaptively. The matching is here performed as a function of the filtered input signal AINF, the digital measurement signal X, and the digital estimate signal Y. The filtered input signal AINF represents a desired digital representation of the voltage of the loudspeaker signal SLS on the output terminal OUT. Here, in each case, signal propagation times between the filtered input signal AINF and the loudspeaker signal SLS are to be taken into account that are produced due to the digital-analog conversion and amplification of the amplification device PA. The estimate signal Y represents an instantaneous approximation of the transfer function of the loudspeaker SPK by the filter block SPM as a function of the measurement signal X. Thus, with known methods, a set of coefficients A1, A2, B1, B2 can be defined from the filter input signal X (measurement signal), the filter output signal Y (estimate signal), and the desired signal AINF (filtered input signal).

The coefficients A1, A2, B1, B2 calculated in this way here represent, in particular, the resonance frequency response of the loudspeaker SPK. These coefficients A1, A2, B1, B2 are then used in the first recursive filter HEQ or in the equalizer filter EQ such that the resonance frequency response of the loudspeaker SPK is compensated by the resulting transfer function of the filter HEQ. The coefficients defined by the matching block RAA are consequently used in the first and second recursive filters HEQ, HRES such that the respective resulting transfer functions are inverse relative to each other. A corresponding inverse substitution regulation is expressed by the block BL with the inversion operator. Advantageously, the inversion of the transfer functions can be achieved through the pure transposition of the coefficients A1, A2, B1, B2 that are unchanged numerically.

Therefore, in the described signal-processing circuit, advantageously additional processors or function blocks can be eliminated that calculate the coefficients for the equalizer filter from the coefficients that are output by the matching block RAA, instead, as previously described, the coefficients continue to be used directly.

Figure 2:
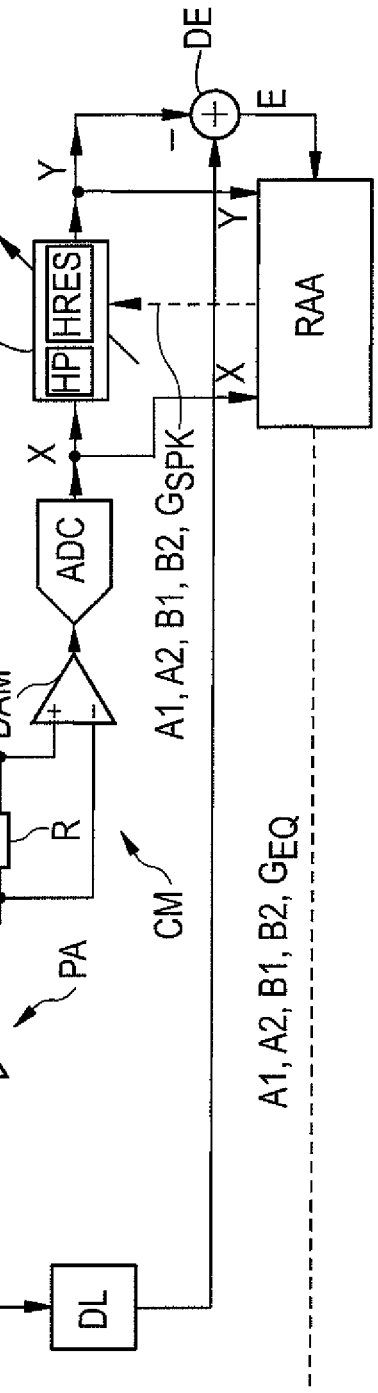
FIG. 2 shows a block diagram of a second embodiment of a signal-processing circuit.

In FIG. 2, an additional embodiment of a signal-processing circuit is shown that essentially involves the embodiment shown in FIG. 1. Therefore, in the following, only the special constructions of individual function blocks will be described in detail.

In the embodiment shown in FIG. 2, the filtered input signal AINF is initially converted by the digital-analog converter DAC into an analog signal and amplified with the amplifier AMP to form the resulting loudspeaker signal SLS that is output on the output terminal OUT on the loudspeaker SPK closed during operation. For the measurement of the current in the loudspeaker signal SLS, between the amplifier AMP and the output terminal OUT, a current measurement resistor or shunt R is provided across which a typically smaller voltage drop is produced that is received by a differential amplifier DAM and output to an analog-digital converter ADC. The analog-digital converter ADC finally outputs the digital, time-discrete measurement signal X.

In the present embodiment, the filtered input signal AINF is fed by a delay element DL to a differential element DE that calculates from the delayed, filtered input signal AINF and the estimate signal Y an error signal E that is fed to the matching block RAA. The error signal E is used in the matching block RAA for the matching of the coefficients from the measurement signal X and the estimate signal Y.

In the present embodiment, the equalizer filter EQ has a total transfer function $H_{EQ}'(z)$ that depends on a weighting factor $G_{EQ}$ and a transfer function $H_{EQ}(z)$ of the first recursive filter of second order, so that $$H_{EQ}'(z) = G_{EQ} \cdot H_{EQ}(z)$$

with $$H_{EQ}(z) = \frac{1 + A1 \cdot z^{-1} + A2 \cdot z^{-2}}{1 + B1 \cdot z^{-1} + B2 \cdot z^{-2}}.$$

The total transfer function $H_{SPK}(z)$ of the filter block SPM is dependent on a second weighting factor $G_{SPK}$, a transfer function $H_{RES}(z)$ of the second recursive filter of second order, and a transfer function $H_{Hp}(z)$ of a digital high-pass filter HP, so that $$H_{SPK}(z) = G_{SPK} \cdot H_{RES}(z) \cdot H_{HP}(z)$$

with $$H_{RES}(z) = \frac{1 + B1 \cdot z^{-1} + B2 \cdot z^{-2}}{1 + A1 \cdot z^{-1} + A2 \cdot z^{-2}}$$

and $$H_{HP}(z) = \frac{1 + C1 \cdot z^{-1}}{1 + D1 \cdot z^{-1}}.$$

As previously described, in the matching block RAA, the coefficients A1, A2, B1, B2 are calculated, wherein for this purpose advantageously a least-means squares, LMS, algorithm can be used. Coefficients A1 and A2 are used in the first recursive filter HEQ in the numerator function and in the second recursive filter HRES in the denominator function. Accordingly, the coefficients B1 and B2 are used in the first recursive filter HEQ in the denominator function and in the second recursive filter HRES in the numerator function. For the respective transposition, no matching or conversion of the coefficients is necessary, but instead these could be used directly or unchanged both in the first and also in the second recursive filters HEQ, HRES.

The coefficients C1, D1 of the high-pass filter HP could be pre-defined for different classes of loudspeakers, for example, small, flat loudspeakers, larger loudspeakers, headsets, and so on, and are advantageously unchanged during operation of the signal-processing circuit. In particular, the coefficients C1, D1 are not matched by an adaptive algorithm in the matching block RAA. However, the coefficients C1, D1 of the high-pass filter HP could be selected or fixed by a programming or an external control signal.

The weighting factors $G_{EQ}$ and $G_{SPK}$, however, could likewise be matched as a function of the measurement signal X, the estimate signal Y, and the error signal E or the filtered input signal AINF and could be output to the equalizer filter EQ and the filter block SPM. Thus, the transfer response of the attached loudspeaker SPK could be defined as good as possible and simultaneously an optimum equalizer function in the equalizer filter EQ can be calculated.

Because the matching of the coefficients A1, A2, B1, B2 and the weighting factors $G_{EQ}$, $G_{SPK}$ is performed continuously during operation of the signal-processing circuit, it is guaranteed both that the corresponding filter functions are calculated optimally for an attached loudspeaker for the startup of the circuit and also for a change of system parameters, for example, the temperature of the attached loudspeaker.

Figure 3:
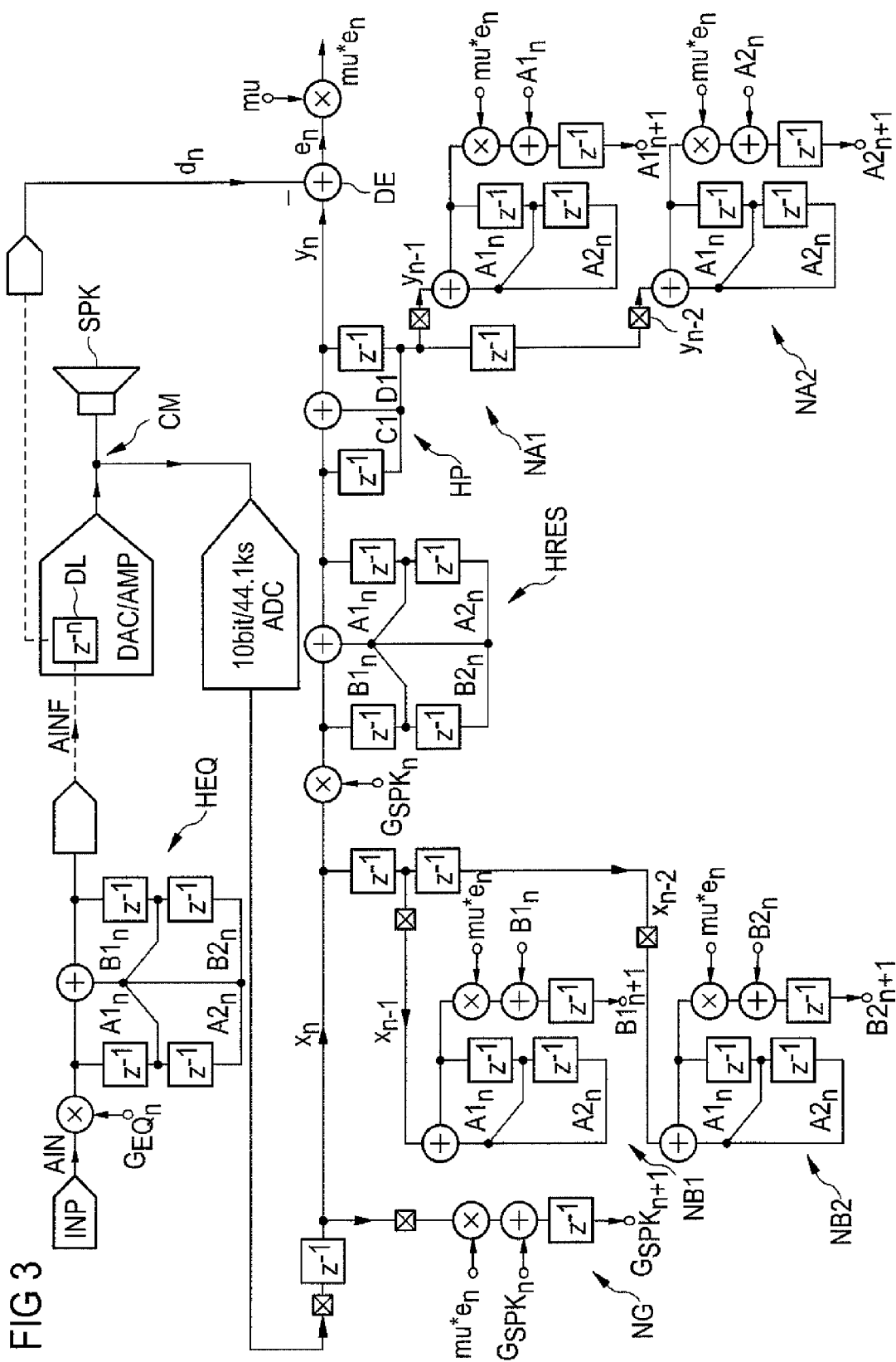
FIG. 3 shows a schematic diagram of a realization of an LMS algorithm in a third embodiment of a signal-processing circuit.

FIG. 3 shows an additional embodiment of a signal-processing circuit that is based on the previously described embodiments. In particular, in FIG. 3 the implementation of the respective digital filters HEQ, HRES, HP, as well as the structures for the matching of the coefficients are shown explicitly. The first recursive filter HEQ and the second recursive filter HRES are realized in the embodiment of FIG. 3 each with structures that are designated, in general, as direct-form-2. The high-pass filter HP in the coefficients C1, D1 is also realized in direct-form-2.

The digital input signal AIN is weighted according to a weighting with a weighting factor $G_{EQn}$ at time n and filtered with the structure of the first recursive filter HEQ. For further processing, the filtered input signal AINF is fed to the digital-analog converter DAC and the amplifier AMP that are presently shown only schematically. The filtered input signal AINF is fed with corresponding delay as instantaneous value $d_n$ of the filtered input signal AINF to a differential element DE on whose other input an instantaneous value $y_n$ of the estimate signal Y is applied. This instantaneous value $y_n$ of the estimate signal is produced by the corresponding processing of the measurement signal X with the second recursive filter HRES, the weighting factor $G_{SPKn}$ at time N, and the high-pass filter HP. The output signal of the differential element DE represents an instantaneous error value $e_n$ at time N that is weighted multiplicatively with a matching factor MU. From this weighting, a factor mu*$e_n$ results that is used for the matching of the coefficients and weighting factors.

The blocks NB1, NB2, NA1, NA2, and NG represent an implementation of the LMS algorithm for the coefficients of the second recursive filter HRES. In particular, a new coefficient $B1_{n+1}$ that is used for the next filter operation, that is, at the subsequent sampling time n+1 in the filters HEQ and HRES is calculated in the block NB1 from a value of the measurement signal $x_{n-1}$ delayed in time by a sampling value with corresponding processing. The new coefficient $B1_{n+1}$ is here produced, in particular, from the instantaneous coefficient value $B1_n$, the value $x_{n-1}$ after corresponding processing, and a weighting with the factor mu*$e_n$.

In an analogous way, new coefficient values $A1_{n+1}$ and $A2_{n+1}$ for the next filter step n+1 are also calculated in the blocks NB2, NA1, NA2 and from the respective preceding coefficient values $B2_n$, $A1_n$, $A2_n$. Furthermore, these new coefficients are based on the previous signal values $x_{n-1}$, $x_{n-2}$, $y_{n-1}$, and $y_{n-2}$. Matching the weighting factor $G_{SPK}$ in the block NG is performed in an analogous way.

The structures shown in the blocks NB1, NB2, NA1, NA2, NG represent one implementation of the LMS algorithm selected as an example, but it could be replaced by other matching structures.

The structure shown in FIG. 3 distinguishes itself in that it could be implemented as fixed structures in hardware, for example, in an integrated circuit, without having to instruct the use of a special processor. Therefore, the described signal-processing circuit could be both produced and also operated at low expense.

As previously described, the coefficients C1, D1 could be permanently programmed or could be read from a register as fixed, preset values from various possible values. Furthermore, the coefficients A1, A2, B1, B2 at a startup of the signal-processing circuit could be initialized with fixed or stored coefficients. This applies analogously also for the weighting factors to be used.

If it is necessary to model the resonance frequency response of the attached loudspeaker even more precisely and/or to better match the filter function of the equalizer filter HEQ, additional recursive filter elements of second order could be easily inserted accordingly into the described structure, wherein the necessary matching algorithms or matching structures are to be matched in a known way.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A signal-processing circuit for the generation of a loudspeaker signal, comprising:
   an input for the feeding of a digital, time-discrete input signal;
   a digital equalizer filter that is coupled to the input and has at least one first recursive filter of second order that is defined by a first adjustable set of coefficients;
   an amplification device coupled to the equalizer filter, said amplification device comprises a digital-analog converter and an amplifier and is configured to generate the loudspeaker signal as a function of the filtered input signal and to output on an output terminal;
   a current measurement device that is coupled to the amplification device and is configured to output a digital, time-discrete measurement signal that represents a current of the loudspeaker signal;
   a digital filter block that is configured to generate, through filtering, an estimate signal as a function of the measurement signal, wherein for this purpose the digital filter block has at least one second recursive filter of second order that is defined by a second adjustable set of coefficients; and
   a matching block that is configured to determine a new set of coefficients as a function of the measurement signal, the estimate signal, and the filtered input signal and to use the newly determined coefficients in the first and second adjustable set of coefficients such that the resulting transfer functions ($H_{EQ}(Z)$, $H_{RES}(Z)$) of the at least one first recursive filter and the at least one second recursive filter are inverse relative to each other.

2. The signal-processing circuit according to claim 1, wherein
the new set of coefficients comprises at least the coefficients A1, A2, B1, B2; the transfer function of the at least one first recursive filter in the Z-plane reads $$H_{EQ}(z) = \frac{1 + A1 \cdot z^{-1} + A2 \cdot z^{-2}}{1 + B1 \cdot z^{-1} + B2 \cdot z^{-2}}$$

and
the transfer function of the at least one second recursive filter in the Z-plane reads $$H_{RES}(z) = \frac{1 + B1 \cdot z^{-1} + B2 \cdot z^{-2}}{1 + A1 \cdot z^{-1} + A2 \cdot z^{-2}}.$$

3. The signal-processing circuit according to claim 1, wherein the filter block additionally comprises, for filtering, a digital high-pass filter.

4. The signal-processing circuit according to claim 1, wherein
the digital equalizer filter is configured to additionally weight the input signal with a first weighting factor;
the digital filter block is configured to generate, in the filtering, the estimate signal additionally as a function of a second weighting factor; and
the matching block is configured to determine a new weighting factor as a function of the measurement signal, the estimate signal, and the filtered input signal and to set the first and the second weighting factor as a function of the newly determined weighting factor.

5. The signal-processing circuit according to claim 1, wherein the matching block is configured to perform the determination by means of an LMS algorithm.

6. The signal-processing circuit according to claim 5, wherein the matching block is configured to determine an instantaneous error value used for the LMS algorithm from a difference of an instantaneous value of the estimate signal and a delayed instantaneous value of the filtered input signal, wherein the delay is selected matching to a signal propagation time in the amplification device.

7. The signal-processing circuit according to claim 1, wherein the current measurement device comprises a current measurement resistor and an analog-digital converter that outputs the measurement signal as a function of a voltage drop across the current measurement resistor.

8. The signal-processing circuit according to claim 1, wherein the amplifier comprises one of the following:
   a class-A amplifier;
   a class-AB amplifier;
   a class-D amplifier.

9. The signal-processing circuit according to claim 1, wherein the matching block is further configured to determine the new set of coefficients by minimizing a difference between the estimate signal and the filtered input signal.

10. A signal-processing method, comprising:
   providing of a digital, time-discrete input signal;
   filtering of the input signal with at least one first recursive filter of second order that is defined by a first adjustable set of coefficients;
   generation of an analog loudspeaker signal as a function of the filtered input signal;
   generation of a digital, time-discrete measurement signal that represents a current of the loudspeaker signal;
   generation of an estimate signal through filtering of the measurement signal with at least one second recursive filter of second order that is defined by a second adjustable set of coefficients;
   determination of a new set of coefficients as a function of the measurement signal, the estimate signal, and the filtered input signal; and
   use of the newly determined coefficients in the first and second adjustable set of coefficients such that the resulting transfer functions ($H_{EQ}(Z)$, $H_{RES}(Z)$) of the at least one first recursive filter and the at least one second recursive filter are inverse relative to each other.

11. The signal-processing method according to claim 10, wherein the new set of coefficients comprises at least the coefficients A1, A2, B1, B2;
   the transfer function of the at least one first recursive filter in the Z-plane reads $$H_{EQ}(z) = \frac{1 + A1 \cdot z^{-1} + A2 \cdot z^{-2}}{1 + B1 \cdot^{-1} + B2 \cdot z^{-2}}$$

and
   the transfer function of the at least one second recursive filter in the Z-plane reads $$H_{RES}(z) = \frac{1 + B1 \cdot z^{-1} + B2 \cdot z^{-2}}{1 + A1 \cdot z^{-1} + A2 \cdot z^{-2}}.$$

12. The signal-processing method according to claim 10, wherein the generation of the estimate signal additionally comprises a filtering with a digital high-pass filter.

13. The signal-processing method according to claim 10, wherein
   the filtering of the input signal additionally comprises a weighting with a first weighting factor;
   the generation of the estimate signal additionally comprises a weighting with a second weighting factor;
   a new weighting factor is determined as a function of the measurement signal, the estimate signal, and the filtered input signal;
   and the first and the second weighting factor are set as a function of the newly determined weighting factor.

14. The signal-processing method according to claim 10, wherein the determination of the new set of coefficients and/or of the new weighting factor is performed by means of an LMS algorithm.

15. The signal-processing method according to claim 10, wherein an instantaneous error value that is used for the LMS algorithm is determined from a difference of an instantaneous value of the estimate signal and a delayed instantaneous value of the filtered input signal.

16. The signal-processing method according to claim 10, wherein the determination of a new set of coefficients comprises minimizing a difference between the estimate signal and the filtered input signal.

* * * * *